(12) United States Patent
Nikitin et al.

(10) Patent No.: US 6,701,503 B2
(45) Date of Patent: Mar. 2, 2004

(54) OVERLAP REMOVER MANAGER

(75) Inventors: Andrey A. Nikitin, Moscow (RU);
Elyar E. Gasanov, Moscow (RU);
Andrej A. Zolotykh, Moskovskaya Oblast (RU)

(73) Assignee: LSI Logic Corporation, Milpitas, CA (US)

( * ) Notice: Subject to any disclaimer, the term of this patent is extended or adjusted under 35 U.S.C. 154(b) by 185 days.

(21) Appl. No.: 10/072,008

(22) Filed: Feb. 7, 2002

(65) Prior Publication Data

US 2003/0149952 A1 Aug. 7, 2003

(51) Int. Cl.[7] .................................................. G06F 9/45
(52) U.S. Cl. .................................................. 716/9; 716/2
(58) Field of Search ...................... 716/8, 9, 18, 2, 716/5

(56) References Cited

U.S. PATENT DOCUMENTS 6,532,582 B1 * 3/2003 Zolotykh et al. ............. 716/11
6,543,032 B1 * 4/2003 Zolotykh et al. .............. 716/2
6,564,361 B1 * 5/2003 Zolotykh et al. .............. 716/8
2002/0162085 A1 * 10/2002 Zolotykh et al. ............. 716/18

* cited by examiner

Primary Examiner—Stacy A Whitmore
(74) Attorney, Agent, or Firm—Suiter West PC LLO

(57) ABSTRACT

The present invention is directed to a system and method for providing an overlap remover manager. A method for removing overlaps in a circuit design for an integrated circuit may include initiating an overlap remover manager, wherein the overlap remover manager is suitable for moving cells of an integrated circuit design to remove cell overlaps. A search for critical wires is performed and a determination is made of which violated moves of cells caused at least one critical wire. A determined violated move of the cells is rolled back and the overlap remover manager employed to remove overlaps between rolled back cells.

35 Claims, 3 Drawing Sheets

OVERLAP REMOVER MANAGER

FIELD OF THE INVENTION

The present invention generally relates to the field of integrated circuit design, and particularly to a system and method for providing an overlap manager to reduce timing worsening and avoid ramptime violations in an improved manner when designing an integrated circuit.

BACKGROUND OF THE INVENTION

The integrated circuit (IC) has permeated most every aspect of modern life. From home to business uses, a variety of functions are provided by integrated circuits. To provide this diverse and wide ranging functionality, integrated circuits may be designed for both general uses to provide generalized operation as well as configured in a manner optimized to a given task or set of tasks. Thus, the design of an integrated circuit may take a wide range of configurations.

During the design of an integrated circuit, a timing driven resynthesis procedure may be employed to test whether the design of the integrated circuit complies with contemplated timing parameters. After this procedure is employed, an overlap remover manager may be employed to get a legal placement of the design. Although a timing driven resynthesis procedure may be configured to attempt to place new cells without overflows, overlap of the cells may still be possible. For instance, a design achieved from an overlap remover manager may not have cell overlaps. However, ramptime violations and the timing characteristics of the paths may be worse in general than before the overlap remover manager was utilized.

Therefore, it would be desirable to provide an overlap remover manager.

SUMMARY OF THE INVENTION

Accordingly, the present invention is directed to a system and method for providing an overlap remover manager. In a first aspect of the present invention, a method for removing overlaps in a circuit design for an integrated circuit includes initiating an overlap remover manager, wherein the overlap remover manager is suitable for moving cells of an integrated circuit design to remove cell overlaps. A search for critical wires is performed and a determination is made of which violated moves of cells caused at least one critical wire. A determined violated move of the cells is rolled back and the overlap remover manager employed to remove overlaps between rolled back cells. In a second aspect of the invention, violated cells that were rolled back are fixed and the overlap remover manager run to remove overlaps between rolled back cells and at least one other cell which was not rolled back. If overlaps remain, the cells are unfixed and the overlap remover manager run.

In a third aspect of the present invention, a system for removing overlaps in a circuit design for an integrated circuit includes a memory suitable for storing a program of instruction and a processor communicatively coupled to the memory. The program of instructions configures the processor to initiate an overlap remover manager, wherein the overlap remover manager is suitable for moving cells of a received integrated circuit design to remove cell overlaps. A search for critical wires is performed and a determination is made of which violated moves of cells caused at least one critical wire. A determined violated move of the cells is rolled back and the overlap remover manager employed to remove overlaps between rolled back cells.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 5, exemplary embodiments of the present invention are shown. The present invention provides management of an overlap remover to reduce the timing worsening and to avoid the ramptime violations. An overlap remover manager, such the overlap remover described in U.S. Pat. No. 6,026,223 and U.S. patent application Ser. No. 09/955,698 filed Sep. 19, 2001, which are herein incorporated by reference in their entirety, may be applied after timing driven resynthesis, such as timing driven resythesses described in U.S. patent application Ser. No. 09/677,475, filed Oct. 2, 2000, which is herein incorporated by reference in its entirety, in order to get a legal placement of the design. Although timing driven resynthesis attempts to place new cells without overflows, overlap of the cells may still be encountered. For instance, usually the design achieved from an overlap remover, such as a pure overlap remover, will not have cell overlaps. However, the ramptime violations and the timing characteristics of the paths may be worse in general than before the overlap remover was utilized. In the present invention, an overlap remover manager is provided which prevents ramptime violations and reduces timing worsening of the chip.

A location of any cell of the design may be determined by the following characteristics: the coordinate x, the coordinate y and the rotation of the cell. In the present discussion, these characteristics will be referred to as the coordinates of the cell. Typically, an overlap remover manager moves the cells (or changes the coordinates of the cells) in order to remove cell overlaps. Herein the coordinates of the cells before the overlap removing will be described as old coordinates, and the coordinates of the cells after the overlap remover manager is utilized are referred to as current coordinates. In some instances, after movement of the cells made by an overlap remover, the distances between the cell pins connected by a wire may be highly increased (herein such a wire will be referred to as a critical wire). Such a distance increase may directly cause ramptime and timing violation appearance.

The present invention, through the use of an overlap remover manager, may determine which cell movement led to the ramptime and timing violation appearances (called violated moves), and may then "roll back" these moves. For example, a roll back of a cell move may involve moving the cell back to the old position from the current position, replace the current coordinates of the cell by the old ones, and like manipulation as contemplated by a person of ordinary skill in the art.

Figure 1:
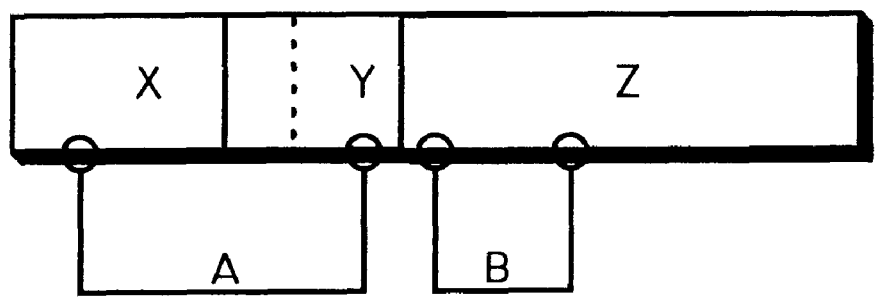
FIG. 1 is an illustration of an exemplary embodiment of the present invention wherein an overlap between cells is shown.

FIG. 1 is an illustration of an exemplary embodiment of the present invention wherein three cells having overlaps are shown, in which pins of the cells X and Y are connected to the wire A. Pins of the cells Y and Z are connected to the wire B. An overlap remover manager is then run.

Figure 2:
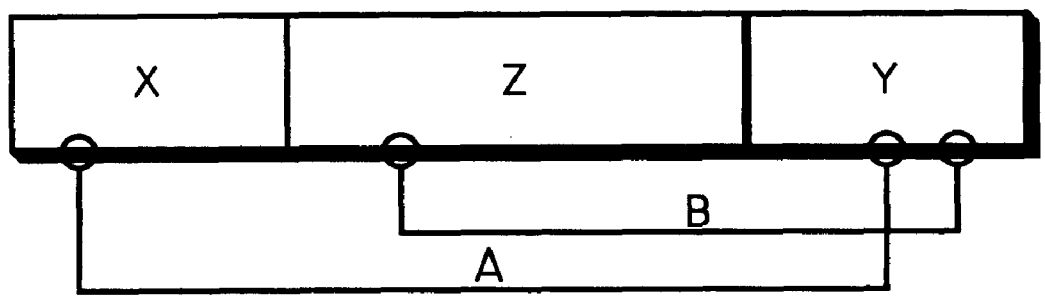
FIG. 2 is an illustration of an exemplary embodiment of the present invention wherein cells moved after an overlap manager is employed are shown.

As shown in FIG. 2, the overlap remover procedure removes all overlaps. However, wire A becomes critical (too long) because of the violated far move of the cell Y. The cell Y is moved back to its old position.

Figure 3:
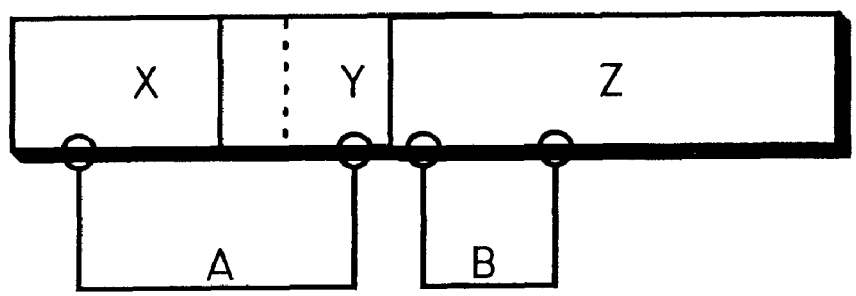
FIG. 3 is an illustration of an exemplary embodiment of the present invention wherein cells are rolled-back due to critical wires encountered, as shown in FIG. 2.
Figure 4:
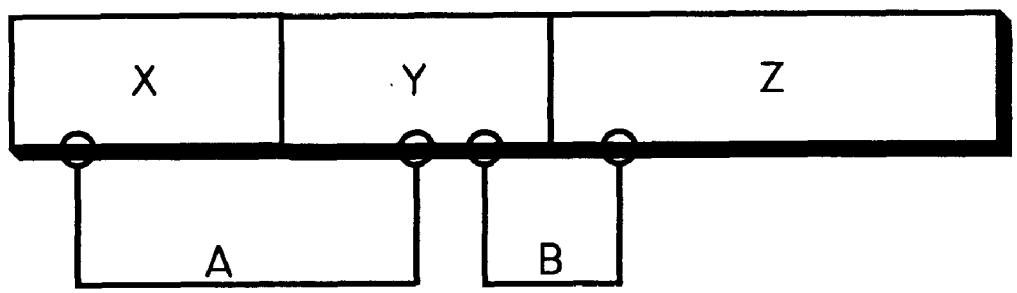
FIG. 4 is an illustration of an exemplary embodiment of the present invention wherein an overlap manager is utilized which moves cells in a manner which does not cause a critical wire.

After this violation is eliminated, an overlap remover procedure is employed to reduce the movement of the moved back cell Y, as shown in FIG. 3. After the overlap remover procedure is again employed, all overlaps are eliminated, with no violations appearing.

Figure 5:
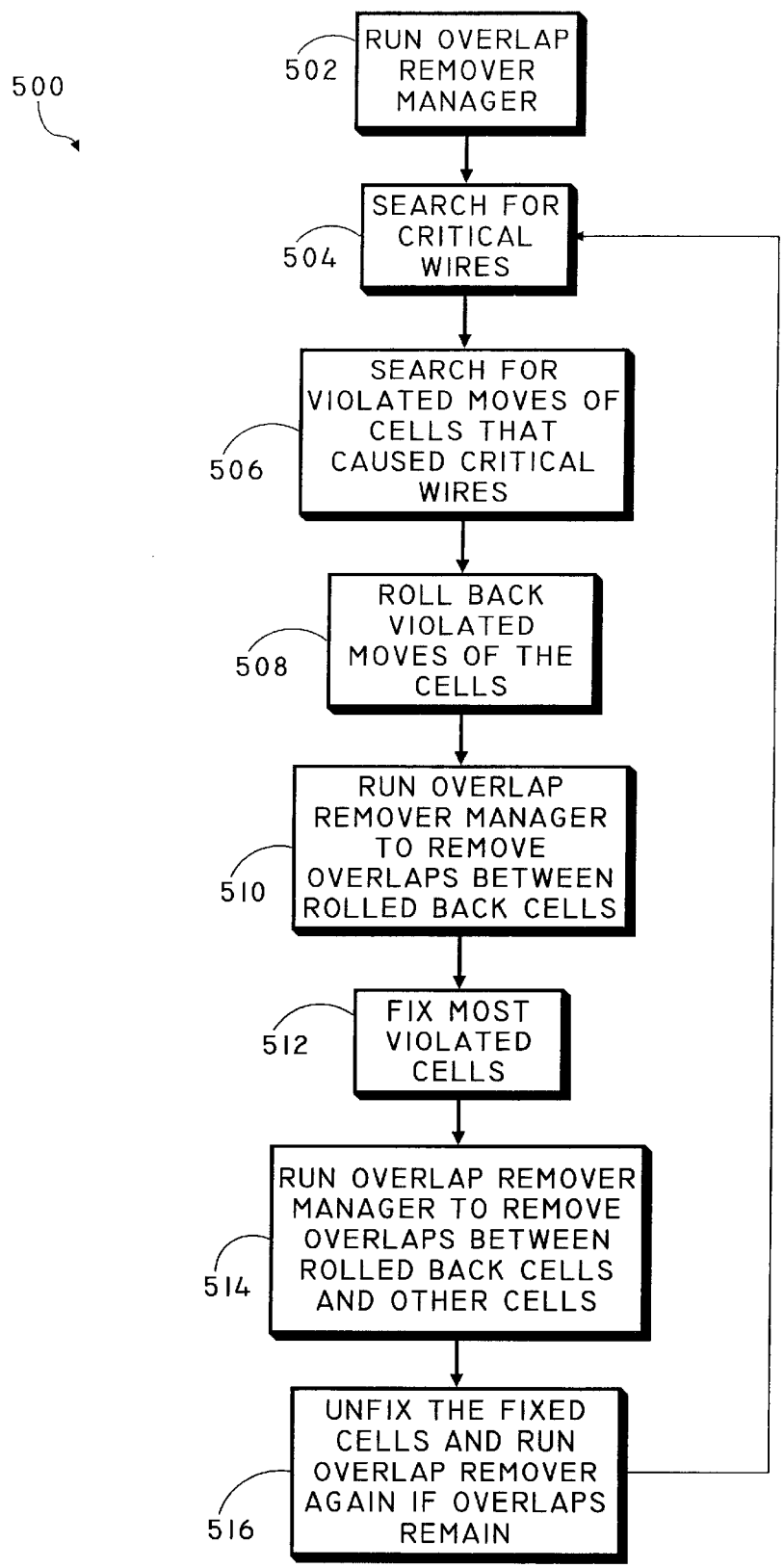
FIG. 5 is a flow diagram of an exemplary method of the present invention wherein an overlap remover procedure is shown.

Referring now to FIG. 5, an exemplary method 500 of the present invention is shown where an overlap remover procedure suitable for correcting cell overlap is shown. As it is described more precisely below Overlap Remover Manager procedure comprises of the following basic steps:

1) First, an overlap remover manager is run 502.
2) A search for critical wires is performed 504.
3) A determination is then made for all the violated moves of the cells that cause the critical wires 506.
4) The violated moves of the cells that cause the critical wires are then rolled back 508.
5) An overlap remover manager is then employed to remove overlaps between rolled back cells 510. In an embodiment of the invention, all other cells are not taken into account during this step.
6) The most violated cells that were rolled back to their old positions are then fixed 512.
7) The overlap remover is then run to remove overlaps between rolled back cells and all other cells 514.
8) If some overlaps remain, the fixed cells are unfixed and the overlap remover manager is run again 516.

Preferably, in order to achieve the best result it is valuable to repeat steps 2–8 several times. The number of iterations may be dynamically chosen according to the quality of the result obtained after the last iteration of the overlap remover manager, according to the given runtime restrictions, and the like as contemplated by a person of ordinary skill in the art without departing from the spirit and scope thereof. As experiments show the most powerful results are achieved if the rate of moved back cells is decreased from iteration to iteration. At the first iteration it is valuable to move back about 0.1%–0.5% of all cells, and at the last iteration this rate is about 0.01%–0.001%.

In the present discussion, a system and method is described that enables a search for the critical wires and how to search for the corresponding violated moves of the cells. One method to perform such a search is to examine all the cells. For instance, for each cell, the cell may be returned to an original placement, and then all ramptime and timing values recalculated to understand whether this movement reduced the ramptime and timing violations. The magnitude of the improvement of the violations may be considered as a suitable characteristic of the quality of the given cell move back. In practice, this approach is generally not utilized due to the time requirements.

Accordingly, in an aspect of the present invention, a search algorithm as employed in a system and method of the present invention is employed.

Searching for the Most Critical Wires

As previously discussed, in an embodiment of the invention, a wire is called a critical wire if and only if its length was increased by an overlap remover, with such length increase causing ramptime and/or the timing violation appearances.

First, all the wires are examined one by one. If a wire has a ramptime violation, this wire may be automatically assumed to be a critical wire.

At the second step, the wires are again examined. In some instances, it may not be enough to estimate how much the delay of a wire was increased to understand whether the given wire is critical. For example, some local increases of a delay may not lead to a timing violation appearance. The wire delays, for example, may be too small in comparison with the cell delays. Thus, in an embodiment of the invention, the cell delays are taken into account without the wire delays.

For each wire, cells with output pins connected to a given wire are examined. For each of these cells, the delay increase is calculated, such as to calculate the maximum of the increase of delays between all the input pins of the cells and the output pins connected to the considered wire. This magnitude may provide a good estimation of the wire criticality.

It is preferred to examine only cells of the critical paths. The path is called critical if and only if it has a timing violation, that is, the path delay does not satisfy the timing restrictions.

One more criterion to choose the most critical wires may be applied if not only the worst path delay is optimized, but also the total violation that is the sum of the timing violations of all ending points. In this case, it is more powerful to consider only critical paths with the timing violations equal to the timing violation of some ending point. This criterion further ensures that if the delay of this path is decreased, the timing violation of the corresponding ending point is also decreased.

After the estimation of criticality of all the wires, the most critical wires may be easily chosen.

Searching for the Most Violated Cell Moves

The problem considered in the present part of the discussion of the invention is the search for the most violated cell moves. A violated cell move is a cell move that leads to an appearance of a critical wire. The problem of searching for critical wires and choosing the most critical of them is considered in the previous part of the discussion. Here, several criteria for fast determination of violated cell moves are discussed, and should not be taken to be exhaustive. A variety of criteria may be utilized in accordance with the present invention as contemplated by a person of ordinary skill in the art without departing from the spirit and scope thereof.

First, all critical wires are examined. For each critical wire, cell pins connected to the wire are considered. Using the old cell coordinates and the current cell coordinates, the magnitudes of the moves of the considered pins may be calculated. Considering the largest pin moves, a list of cells with the most violated moves may be obtained.

Another criterion which may be employed by the present invention is to take only pins (respectively, cells) with the move magnitude that is more than the average magnitude of the pin moves.

A further criterion involves the examination of all the cell pins connected to a considered critical wire. Each pin is moved back to the old position, and a determination made as to whether the length of the wire is decreased. If the length of the wire is decreased, then the examined pin is critical. In an embodiment of the invention, it is not necessary to examine all pins connected to the wire, it is enough to consider only pins laid on the border of the bounding box of the wire pins.

Through experimentation, it has been determined that the most powerful criterion may be obtained as a combination of several ones described above, as well as other criterion without departing from the present invention as contemplated by a person of ordinary skill in the art.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the OVERLAP REMOVER MANAGER of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for removing overlaps in a circuit design for an integrated circuit, comprising:
    (a) initiating an overlap remover manager, wherein the overlap remover manager is suitable for moving cells of an integrated circuit design to remove cell overlaps;
    (b) searching for critical wires;
    (c) determining which violated moves of cells caused at least one critical wire;
    (d) rolling back a determined violated move of the cells;
    (e) employing the overlap remover manager to remove overlaps between rolled back cells;
    (f) fixing violated cells that were rolled back;
    (g) running overlap remover manager to remove overlaps between rolled back cells and at least one other cell which was not rolled back; and
    (h) unfixing fixed cells if overlaps remain and running overlap remover manager.

2. The method as described in claim 1, wherein timing driven resynthesis is employed before initiating an overlap remover manager of step (a).

3. The method as described in claim 1, wherein a roll back includes at least one of moving a cell to an old position from a current position; and replacing current coordinates of a cell by old coordinates of a cell.

4. The method as described in claim 1, wherein steps (b) through (h) are repeated, in which a number of iterations of such repeating is dynamically chosen according to quality of a result obtained after a last iteration of an overlap remover manager.

5. The method as described in claim 1, wherein a violated move of a cell includes cell movement which lead to at least one of a ramptime and timing violation appearance.

6. The method as described in claim 1, wherein a critical wire includes a wire in which distance between cell pins connected by the wire is increased.

7. The method as described in claim 1, wherein a critical wire includes a wire having a ramptime violation.

8. The method as described in claim 1, wherein determining which violated moves of cells includes examining critical wires, for each critical wire, cell pins connected to the wires are considered; and using old cell coordinates and current cell coordinates, magnitudes of movement of considered pins are calculated.

9. The method as described in claim 8, wherein a list of cells is obtained including violated pin moves based on the magnitudes of movement, the list utilized in step (d).

10. The method as described in claim 8, wherein cell pins with a move magnitude that is more than an average magnitude of pin moves determines the violated move.

11. The method as described in claim 1, wherein cell pins connected to a considered critical wire are examined, each pin is moved back to an old position and a determination is made as to whether length of the wire is decreased, and if so, the examined pin is considered critical.

12. In a program residing in memory, a set of instructions for performing a method for removing overlaps in a circuit design for an integrated circuit, comprising:

(a) initiating an overlap remover manager, wherein the overlap remover manager is suitable for moving cells of an integrated circuit design to remove cell overlaps;

(b) searching for critical wires;

(c) determining which violated moves of cells caused at least one critical wire;

(d) rolling back a determined violated move of the cells; and (e) employing the overlap remover manager to remove overlaps between rolled back cells.

13. The method as described in claim 12, wherein timing driven resynthesis is employed before initiating an overlap remover manager of step (a).

14. The method as described in claim 12, wherein a roll back includes at least one of moving a cell to an old position from a current position; and replacing current coordinates of a cell by old coordinates of a cell.

15. The method as described in claim 12, wherein a violated move of a cell includes cell movement which lead to at least one of a ramptime and timing violation appearance.

16. The method as described in claim 12, wherein a critical wire includes a wire in which distance between cell pins connected by the wire is increased.

17. The method as described in claim 12, wherein a critical wire includes a wire having a ramptime violation.

18. The method as described in claim 12, wherein determining which violated moves of cells includes examining critical wires, for each critical wire, cell pins connected to the wires are considered; and using old cell coordinates and current cell coordinates, magnitudes of movement of considered pins are calculated.

19. The method as described in claim 18, wherein a list of cells is obtained including violated pin moves based on the magnitudes of movement, the list utilized in step (d).

20. The method as described in claim 18, wherein cell pins with a move magnitude that is more than an average magnitude of pin moves determines the violated move.

21. The method as described in claim 12, wherein cell pins connected to a considered critical wire are examined, each pin is moved back to an old position and a determination is m a de as to whether length of the wire is decreased, and if so, the examined pin is considered critical.

22. The method as described in claim 12, further comprising:

(f) fixing violated cells that were rolled back;

(g) running overlap remover manager to remove overlaps between rolled back cells and at least one other cell which was not rolled back; and (h) unfixing fixed cells if overlaps remain and running overlap remover manager.

23. The method as described in claim 22, wherein steps (b) through (h) are repeated, a number of iterations of such repeating dynamically chosen according to quality of a result obtained after a last iteration of an overlap remover manager.

24. A system for removing overlaps in a circuit design for an integrated circuit, comprising:

a memory suitable for storing a program of instructions; and a processor communicatively coupled to the memory, wherein the program of instructions configures the processor to (a) initiate an overlap remover manager, wherein the overlap remover manager is suitable for moving cells of a received integrated circuit design to remove cell overlaps;

(b) search for critical wires;

(c) determine which violated moves of cells caused at least one critical wire;

(d) roll back a determined violated move of the cells; and (e) employ the overlap remover manager to remove overlaps between rolled back cells.

25. The system as described in claim 24, wherein timing driven resynthesis is employed before initiating an overlap remover manager of step (a).

26. The system as described in claim 24, wherein a roll back includes at least one of moving a cell to an old position from a current position; and replacing current coordinates of a cell by old coordinates of a cell.

27. The system as described in claim 24, wherein a violated move of a cell includes cell movement which lead to at least one of a ramptime and timing violation appearance.

28. The system as described in claim 24, wherein a critical wire includes a wire in which distance between cell pins connected by the wire is increased.

29. The system as described in claim 24, wherein a critical wire includes a wire having a ramptime violation.

30. The system as described in claim 24, wherein determining which violated moves of cells includes examining critical wires, for each critical wire, cell pins connected to the wires are considered; and using old cell coordinates and current cell coordinates, magnitudes of movement of considered pins are calculated.

31. The system as described in claim 24, wherein a list of cells is obtained including violated pin moves based on the magnitudes of movement, the list utilized in step (d).

32. The system as described in claim 24, wherein cell pins with a move magnitude that is more than an average magnitude of pin moves determines the violated moves.

33. The system as described in claim 24, wherein cell pins connected to a considered critical wire are examined, each pin is moved back to an old position and a determination is made as to whether length of the wire is decreased, and if so, the examined pin is considered critical.

34. The system as described in claim 24, wherein the program of instructions further configures the processor to:

(f) fix violated cells that were rolled back;

(g) run an overlap remover manager to remove overlaps between rolled back cells and at least one other cell which was not rolled back; and (h) unfix fixed cells if overlaps remain and run the overlap remover manager.

35. The system as described in claim 34, wherein steps (b) through (h) are repeated, a number of iterations of such repeating dynamically chosen according to quality of a result obtained after a last iteration of an overlap remover manager.

* * * * *